US009218923B2

(12) United States Patent
Johansson

(10) Patent No.: US 9,218,923 B2
(45) Date of Patent: Dec. 22, 2015

(54) DEVICE FOR INDICATING THE STATE OF A SWITCHING APPARATUS

(71) Applicant: ABB Technology Ltd, Zürich (CH)

(72) Inventor: Daniel Johansson, Grängesberg (SE)

(73) Assignee: ABB TECHNOLOGY LTD, Zürich (CH)

( * ) Notice: Subject to any disclaimer, the term of this patent is extended or adjusted under 35 U.S.C. 154(b) by 0 days.

(21) Appl. No.: 14/404,873

(22) PCT Filed: May 3, 2013

(86) PCT No.: PCT/EP2013/059291
§ 371 (c)(1),
(2) Date: Dec. 1, 2014

(87) PCT Pub. No.: WO2014/005746
PCT Pub. Date: Jan. 9, 2014

(65) Prior Publication Data
US 2015/0194276 A1 Jul. 9, 2015

(30) Foreign Application Priority Data
Jul. 3, 2012 (EP) .................................... 12174794

(51) Int. Cl.
*G01R 31/327* (2006.01)
*H01H 9/16* (2006.01)
*H01H 1/00* (2006.01)
*H01H 9/00* (2006.01)
*H01H 71/04* (2006.01)
*H01H 71/46* (2006.01)
*H01H 73/12* (2006.01)

(52) U.S. Cl.
CPC ............... *H01H 9/16* (2013.01); *H01H 1/0015* (2013.01); *H01H 9/0066* (2013.01); *H01H 71/04* (2013.01); *H01H 71/46* (2013.01); *H01H 73/12* (2013.01)

(58) Field of Classification Search
None
See application file for complete search history.

(56) References Cited

U.S. PATENT DOCUMENTS 3,403,297 A 9/1968 Crouch
5,734,547 A * 3/1998 Iversen .................... H02B 1/14 200/16 R

FOREIGN PATENT DOCUMENTS

DE 195 19 721 C1 10/1996
DE 103 22 224 A1 12/2004
EP 1 818 958 A1 8/2007

* cited by examiner

*Primary Examiner* — Minh N Tang
(74) *Attorney, Agent, or Firm* — Birch, Stewart, Kolasch & Birch, LLP

(57) ABSTRACT

A device for indicating the state of an electrical switching apparatus includes a movable contact arranged movable between a first and a second position. The device includes at least one protruding contact element arranged on the movable contact, at least one contact pin arranged in the close vicinity to the movable contact such that said contact element abuts the contact pin when the movable contact is in the first position and said contact element is at a distance from the contact pin when the movable contact is in the second position. The contact element and the contact pin form an electrical switch and a detector arrangement configured to detect when said electrical switch is closed and by that detect when the movable contact is in the first position.

20 Claims, 3 Drawing Sheets

DEVICE FOR INDICATING THE STATE OF A SWITCHING APPARATUS

FIELD OF THE INVENTION

The present invention relates to a device for indicating the state of an electrical switching apparatus including a movable contact, movable between a first and a second position.

PRIOR ART

A switching apparatus might be a closer for quick closing an electric circuit, in particular of a medium or high voltage level. Such a switching apparatus normally has two contacts movable relative each other. Usually the movement is linear. The relative movement can either be achieved in that one of the contacts is movable and the other stationary, or in that both contacts are movable.

The use of a switching apparatus including a movable contact in technical applications for opening and closing an electrical circuit is common and widespread in many fields. Associated therewith is also the need to determine whether a particular switching apparatus is in an open or closed state, for instance to determine if a device is safe to touch during service or that an operation, close or open, has been fully achieved. Within the art, a number of different detectors and indicators are known.

Many position detectors and indicators, however, suffer from disadvantages that render them insufficient in certain applications. For instance, within the area of fast closing switches for high voltage applications, it is crucial for the indicator to operate reliably at high speed and high acceleration. Many types of indicators are prone to breaking if used in applications that require higher speed and high acceleration. The relative speed of the contact of a fast closing switch is normally in the range on 10 m/s or more. However, commercially available micro switches can withstand only about 1 m/s.

To use detectors that are adapted for use at high speed such as an optical indicator, for instance, is also connected to drawbacks in some applications, due to the presence of particles or dirt at the switching apparatus that can block the optical signal used by the indicator and thereby hinder a reliable operation.

Today the solution is to make an extra maneuver of the fast closing switch just to make sure that it is in an open position before the system is taken into service again.

There is therefore clearly a need for a more reliable and efficient detector or indicator that can function in high speed applications without the risk of breaking or delivering unreliable results.

Object and Summary of the Invention

The object of the present invention is to eliminate or at least to minimize the problems described above. This is achieved by a device for indicating the state of a switching apparatus according to the appended claim 1.

The device comprises at least one protruding contact element arranged on the movable contact, a contact pin arranged in the close vicinity to the movable contact such that the contact element is in contact with the contact pin when the movable contact is in the first position and the contact element is at a distance from the contact pin when the movable contact is in the second position, whereby the contact element and the contact pin form an electrical switch, and a detector arrangement configured to detect when the electrical switch is closed and by that detect when the movable contact is in the first position. Suitably, the switching apparatus is in an open state when the movable contact is in the first position and in a closed state when the movable contact is in the second position.

The contact pin can be made very robust and can withstand forces and strains due to the fast closing of the switching apparatus. Thanks to the invention, a simple, robust and reliable indication device is achieved. Thus, the state of a fast closing switching apparatus can be determined to be sure of whether the switch is open or closed and that the operation is fully achieved.

By thus being able to determine with certainty if the switch is in an open position, it can be made safe to handle the equipment, for instance for maintenance purposes. Thanks to the simple and robust construction, the indication device is reliable with a long life span and requires very little maintenance.

The device comprises a mechanical part and an electrical part. The mechanical part is the contact element and the contact pin, and the electrical part is the detection arrangement. The two parts can advantageously be positioned at a distance from each other and connected to each other by one or two insulated connectors, such as cables. Thus, the more sensitive detection arrangement, or at least a main part of it, can be positioned at a safe distance from the switching apparatus at the same time as the robust mechanical part is positioned inside the switching apparatus. Further, thanks to the mechanical nature of the invention and the possibility of mounting the mechanical part inside the switching apparatus, the presence of particles of dirt is not detrimental to the operation of the invention.

According to an embodiment of the invention, the device comprises a power supply and a first resistor arranged to form a closed electric circuit together with the electrical switch formed by the contact element and the contact pin. Preferably, the first resistor is arranged in series with the first switch to avoid short circuit when the switch is closed.

For example, the electric circuit is electrically connected to the movable contact via a support structure. For example, if the movable contact is connected to ground, the same ground potential can be used in the electric circuit. By using the same electric potential as the movable contact, such as a local ground, the indication device requires only one insulated connector for connection to the detection arrangement. The components involved in the circuit are generally standard components, rendering manufacture and adaptation of the indication device easy and cost effective. By being able to use any voltage available at a particular site with the invention, the need for transformers or adapters is also eliminated, rendering the invention even more cost effective and convenient.

According to an embodiment of the invention, the detector arrangement comprises a measuring unit arranged to measure the voltage or current in the circuit, and the detector arrangement is configured to detect when the movable contact is in the first position based on the level of the measured voltage or current. The voltage/current level can be measured by different known equipment. This is a simple way to detect the state of the switching unit.

According to an embodiment of the invention, the device comprises one or two protruding contact elements arranged on the movable contact, a second contact pin arranged in the close vicinity to the movable contact such that one of the one or two contact elements is in contact with the second contact pin when the movable contact is in the second position and the one of the one or two contact elements is at a distance from the second contact pin when the movable contact is in the first position, whereby the movable contact and the second contact pin form a second electrical switch, and the detector arrangement is configured to detect when the second switch is closed and by that detect when the movable contact is in the second position. This embodiment makes it possible to also detect when the switching apparatus is in the second state.

Although it is possible to use the same contact element for detecting both the open and closed states, it is not always convenient due to lack of space inside the switching apparatus.

According to an embodiment of the invention, the device comprises a first and a second contact element arranged on the movable contact at a distance from each other, and the first mentioned contact pin is arranged such that the first contact element is in contact with the first contact pin when the movable contact is in the first position and the first contact element is at a distance from the first contact pin when the movable contact is in the second position, and the second contact pin is arranged such that the second contact element is in contact with the second contact pin when the movable contact is in the second position and the second contact element is at a distance from the second contact pin when the movable contact is in the first position. This embodiment makes it possible to reduce the distance between the contact pins and accordingly reduce the height of the space needed for the contact pins.

According to an embodiment of the invention, the second electrical switch is a part of the closed electric circuit.

According to an embodiment of the invention the detection arrangement is configured to detect whether the movable contact is in the first or second position based on the level of the measured voltage/current.

According to an embodiment of the invention, the second switch is arranged in parallel with the first mentioned switch and the power supply, and the electric circuit comprises a second resistor arranged in series with the second switch, formed by the second contact pin and the contact element, to achieve a differentiated voltage and current level compared to the first switch, and thus make it possible to detect the different positions.

According to an embodiment of the invention, the detector arrangement is configured to detect when both the first mentioned switch and the second switch are opened and by that detect when the movable contact is in a position between the first and the second position and that a possible malfunction has occurred. This embodiment makes it possible to detect when the movable contact has stuck in a position between the opened and closed position.

According to an embodiment of the invention, the contact pin is spring loaded, to improve the contact between the contact pin and the contact element on the movable contact.

BRIEF DESCRIPTION OF THE DRAWINGS

The invention will now be described in more detail with reference to the appended drawings, wherein.

DETAILED DESCRIPTION OF THE INVENTION

Figure 2:
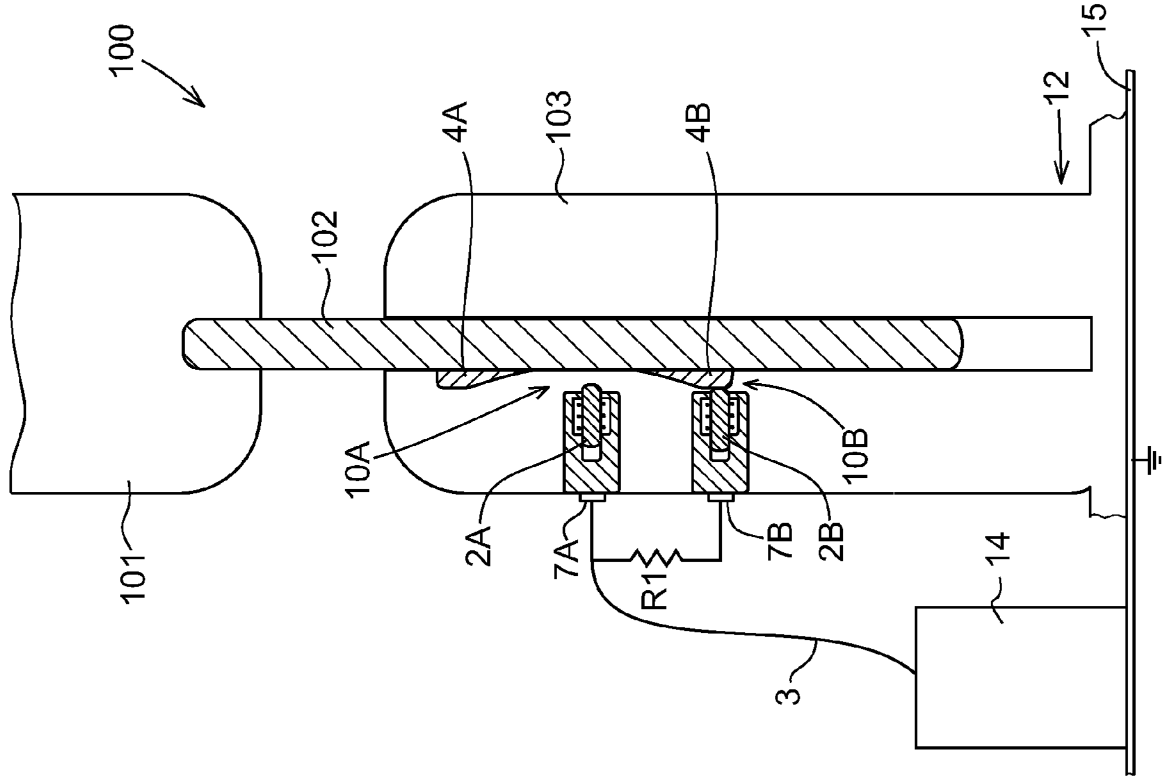
FIG. 2 shows a general cross-sectional view of the device according to FIG. 1 with the switching apparatus in a second state.
Figure 1:
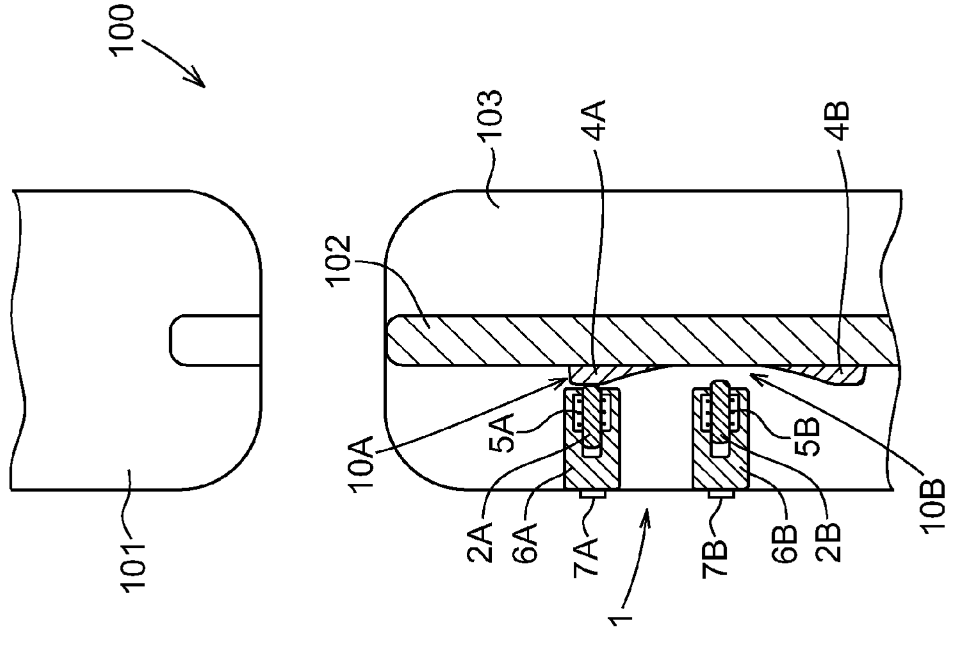
FIG. 1 shows a general cross-sectional view of a part of a device for indicating the state of a switching apparatus according to an embodiment of the invention, with the switching apparatus in a first state.

FIGS. 1 and 2 show an example of a position indicator 1 mounted in connection to a switching apparatus 100. The position indicator 1 is a part of a device for indicating the state of a switching. The illustration is simplified for the sake of clarity in order to focus on the aspects that are relevant for the understanding of the invention. Thus details like the actuator to control the operation of the switch, the casing in which the switch is mounted and other general components are left out. The details can be of any conventional kind and need not be described herein.

The switching apparatus 100 has a stationary contact 101 and a movable contact 102 in the form of a rod or a tube mounted in a housing 103. To close the switch, the movable contact 102 is actuated to perform a motion towards the stationary contact 101 to connect the stationary contact 101 and the movable contact 102. To detect whether the switching apparatus is in a first state, corresponding to an open position where the movable contact 102 is not in contact with the stationary contact 101, as shown in FIG. 1, or in a second state, corresponding to a closed position where the movable and stationary contacts 102, 101 are in contact with each other, as shown in FIG. 2, an indication device according to the invention is used. The switching apparatus includes a support structure 12 for supporting the movable contact 102. The support structure is electrically connected to the movable contact 102, which typically has a local ground potential. The support structure includes the housing 103 which surrounds the movable contact 102 and supports the movable contact, a bottom flange mounted on conducting bars 15 which extend to an external control unit 14 for controlling the movements of the movable contact. Thus, the control unit 14 and the movable contact 102 have the same ground potential.

The position indicator 1 comprises at least one contact pin, but preferably at least two contact pins 2A, 2B, which are mounted adjacent to the movable contact 102 that also constitutes a movable contact for the indication device. On the movable contact 102 are mounted at least one protruding contact element, but preferably at least two contact element 4A, 4B so that a first contact element 4A abuts the first contact pin 2A when the movable contact 102 is in the open state and a second contact element 4B abuts the second contact pin 2B when the movable contact 102 is in the closed state. The protruding contact element 4A, 4B are arranged on the movable contact and are made of a conductive material, preferably the same material as the movable contact. The contact elements are arranged in electrical contact with the movable contact. The contact elements can also be a part of the movable contact. Thus, the first contact pin 2A and the movable contact 102 form a first electrical switch 10A, and the second contact pin 2B and the movable contact 102 form a second electrical switch 10B.

The contact elements 4A, 4B are preferably wedge-shaped to give a secure and reliable operation of the contact pins 2A, 2B and thereby allow them to move in relation to the terminals 6A, 6B without being subjected unduly to wear and tear.

Each of the first and second contact pins 2A, 2B are mounted in a terminal 6A, 6B made of a conducting material, so that they can perform a linear movement towards the movable contact 102 and are at all times in contact with the terminal 6A, 6B. Each of the terminals 6A, 6B is mounted in an insulting sleeve 6C, 6D made of an insulating material. Furthermore, the first and second contact pins 2A, 2B are preloaded by conventional mechanical springs 5A, 5B, respectively, that urge the contact pins 2A, 2B towards the movable contact 102.

Each of the first and second terminals 6A, 6B also comprise a first and second connecting terminal 7A, 7B that can be connected to further components of the indication device 1. The material used for contact pins and the terminals is a conductive metal material, such as aluminium, copper, or steel. Thus, by the arrangement of the first and second contact pins 2A, 2B within a terminal 6A, 6B that is in turn connected to connecting terminals 7A, 7B allow the contact pins 2A, 2B to be in electrical contact with the connecting terminals 7A, 7B. The movable contact 102 is connected to a known electrical potential, preferably to ground or a local ground (not shown). As shown in FIG. 2, the terminals 7A, 7B are connected to each other by a resistor R1. The terminal 7A is, for example, connected to a control unit 14 of the switching apparatus via a cable 3. The control unit 14 includes a detector arrangement 8 configured to detect when the first or second switches are closed and by that detect when the movable contact is in the opened or closed position. In an alternative embodiment, the control unit is also configured to detect when both the first and the second switch are opened and by that detect when the movable contact is in a position between the first and the second position. This embodiment makes it possible to detect that a malfunction has occurred, for instance that the movable contact has get caught in a position between the first and second position. The control unit includes logic circuits to judge the state of the switching apparatus based on the output from the detecting unit 8C, in FIG. 4. In an alternative embodiment, the detector arrangement 8 can be located outside the control unit 14.

Figure 3:
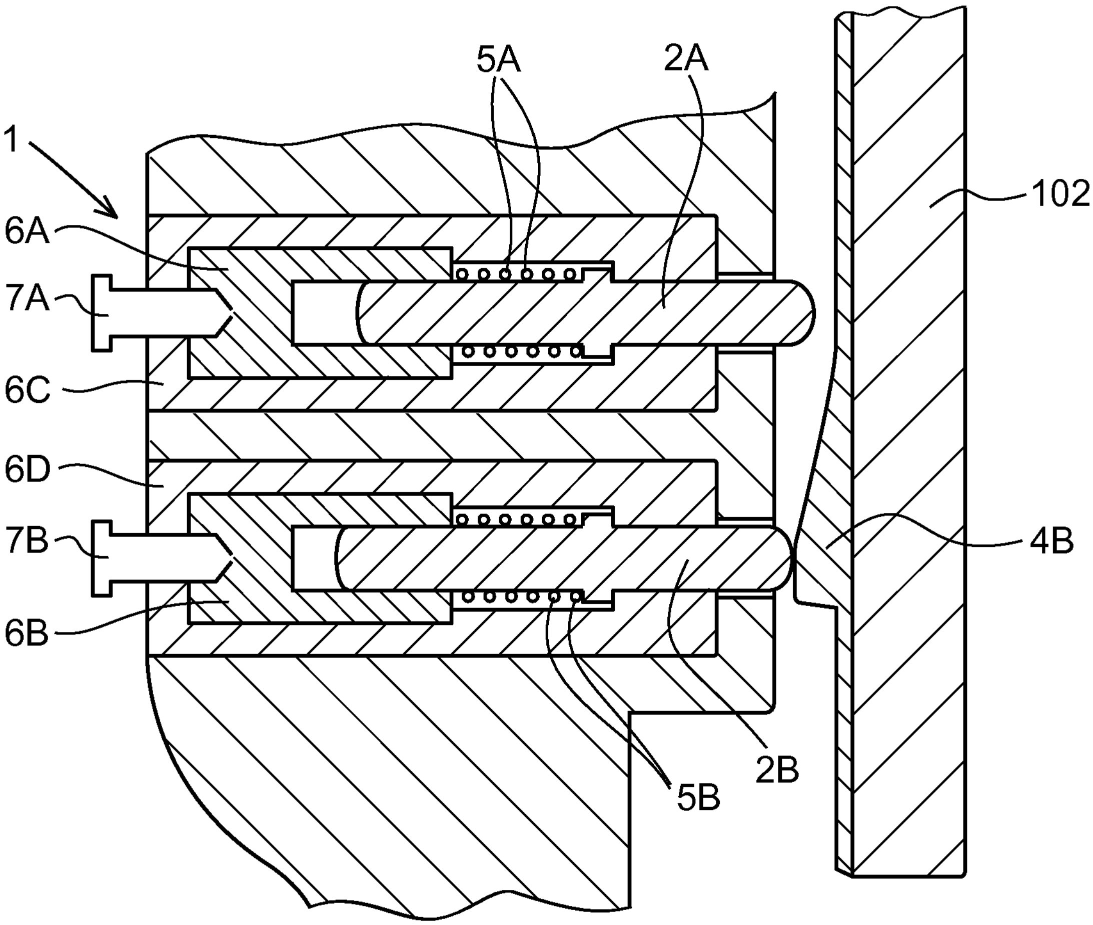
FIG. 3 shows a cross-sectional view of the device of FIGS. 1 and 2 at a close-up.

In FIG. 3, a cross-sectional view of a close-up of the mechanical part of the position indicator 1 is shown when the switching apparatus 100 is in the second state, i.e. a closed position as shown in FIG. 2. In this position, the second contact element 4B abuts the second contact pin 2B so that it is pushed against the preloaded spring 5B into the terminal 6B. Thus, the second contact element 4B is electrically connected to the second connecting terminal 7B so that a current can flow from one to the other.

As can be seen in the FIG. 2, the first contact pin 2A is not in contact with the movable contact 102, or any of the first and second contact elements 4A, 4B, and thus no electrical connection from the first connecting terminal 7A to the movable contact 102 is made. Thus, in a closed state, the second switch 10B is closed and the first switch 10A is opened.

If the movable contact 102 and the switching apparatus 100 had been in an open position, the conditions would be reversed so that there would be an electrical connection between the first connecting terminal 7A and the movable contact 102 but not between the second connecting terminal 7B and the movable contact 102. Thus, in an open state the first switch 10A is closed and the second switch 10B is opened.

Thus, in each of the first and second states of the switching apparatus 100, a current can flow from one of the connecting terminals 7A, 7B to the movable contact 102 but not the other.

Figure 4:
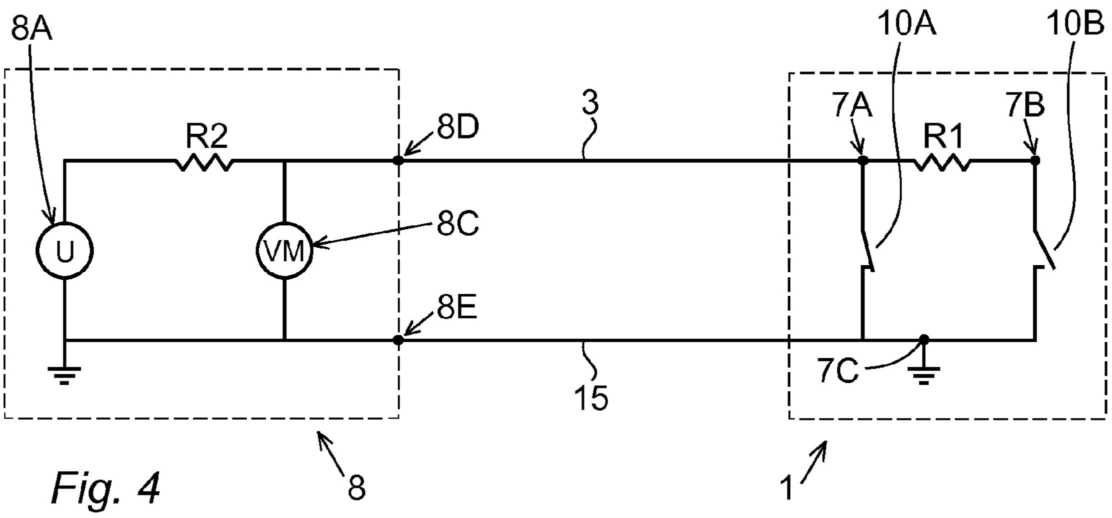
FIG. 4 shows a circuit diagram of the device according to FIG. 1-3.

FIG. 4 shows a circuit diagram of an indication device according to a first embodiment of the invention. The indication device includes the position indicator 1 and a detection arrangement 8 for detecting the states of the switches 10A, 10B and by that the state of the switching apparatus 100, as will be described in more detail further below. The detection arrangement 8 comprises a power supply 8A and a resistor R2 connected to the power supply 8A and a measuring unit 8C, such as a voltmeter, that is arranged to measure a voltage between the resistor R2 and a known electrical potential, such as a local ground. In this case the control unit is configured to detect whether the movable contact 102 is in the first or second position based on the level of the measured voltage. Two detector terminals 8D, 8E are provided for output and input to the detection arrangement 8. The detector arrangement 8 can be a part of the control unit 14 of the switching apparatus.

Alternatively, the measuring unit 8C can be configured to measure the voltage over the resistor R2. In an alternative embodiment, the measuring unit 8C is an ampere meter measuring the current in the circuit. The ampere meter can be arranged to measure the current at different locations in the detector arrangement 8, such as in series with the resistor R2 or between the power supply 8A and local ground. In this case the control unit is configured to detect whether the movable contact 102 is in the first or second position based on the level of the measured current.

The detection arrangement 8 is connected to the position indicator 1 via the first of the detector terminals 8D along an insulated connector/cable 3 that is mounted on the first connecting terminal 7A as shown by the circuit diagram. The resistor R1 is provided between the first connecting terminal 7A and the second connecting terminal 7B. The movable contact 102 is, as has been previously mentioned, connected to ground, a local ground or another known electrical potential that is the same as that to which the power source 8A is connected. This connection can be made via the support structure 12 of the switching apparatus, as shown in FIG. 2, or by a separate connector.

The resistors R1, R2, are preferably high effect resistors, for instance 1 kΩ, 50 W, but their properties can be varied depending on the particular application and the properties of the power source 8A. The power source 8A can vary in the interval 5-500 V depending on the other components. Generally, any available voltage at the site can be used and the resistors R1, R2 selected depending on this voltage. As an example, resistors where the resistance R1=R2=25 kΩ are suitable for use with a voltage of 50V at the power source 8A. Preferably, the resistors are of equal size.

The control unit 14 includes logic circuits, for example, a CPU, a PLC or an FPGA, which are used to judge the state of the switching apparatus based on the measured voltage or current levels. The control unit 14 is configured to detect whether the movable contact is in the first or second position based on the level of the measured voltage or current.

The operation of the indication device will now be described in more detail with reference to the drawings and to a first, second and third preferred embodiment of the invention.

In a first preferred embodiment, the indication device comprises the first and second contact pin 2A, 2B as shown in FIG. 1-3 and the circuit diagram of FIG. 4.

When the switching apparatus 100 is in a first state, i.e. an open position as shown in FIG. 1, the first contact element 4A is in contact with the first contact pin 2A so that a current can flow between the first connecting terminal 7A and the movable contact 102, which means that the first switch 10A is closed. When determining the state of the switching apparatus 100, a potential difference will be measured by the voltmeter 8C, corresponding to the potential difference between the ends of the resistor R1. If the second connecting terminal 7B were not connected to the movable contact 102, and accordingly the second switch 10B is open, no current flows through the resistor R1 and thus no potential difference is detected by the voltmeter 8C.

When the switching apparatus 100 is in a second state, i.e. a closed position as shown in FIG. 2 and in FIG. 3, the second contact element 4B is in contact with the second contact pin 2B so that a current can flow between the second connecting terminal 7B and the movable contact 102, and accordingly the second switch is closed. The first contact element 4A is not in contact with the first contact pin 2A, and accordingly the first switch 10A is open. In this second state, the current flows through the resistor R1. If R1=R2, the voltage level measured by the measuring device 8C is half the voltage level of the voltage source 8A The voltage given by the power source 8A can be of any magnitude and the resistors R2, R1 selected to be appropriate. It is advantageous to choose resistance of the resistor R2 to be equal to the resistor R1 to facilitate distinguishing the first and second states. Thus, if the power source gives 10 V and the resistances are equal, a first state of the switching apparatus 100 corresponding to an open position will give the potential 0 V at the voltmeter, whereas a second state will give the potential 5 V.

If the switching apparatus 100 should malfunction, so that for instance the movable contact 102 is in a position where none of the contact elements 4A, 4B abuts a contact pin 2A, 2B, no current can flow from either of the connecting terminals 7A, 7B to the movable contact 102. Thanks to the placement of the resistor R2, the voltmeter will show the same potential as that given by the power source, i.e. 10V in the example described above. Since two different resistors R2, R1 are thus used, the malfunction can clearly be identified and is not confused with either of the first and second states.

Figure 5:
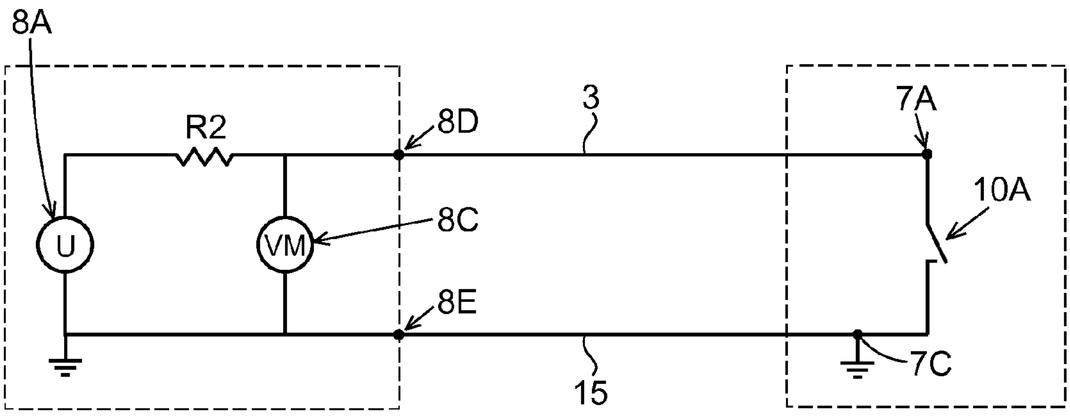
FIG. 5 shows a circuit diagram of the device according to another embodiment of the invention.

In a second preferred embodiment, as shown in FIG. 5, the indication device 1 comprises only one switch 10A including one contact pin 2, namely the first contact pin 2A, and only one contact element that is arranged to be in contact with the first contact pin 2A when the switching apparatus 100 is in a first state corresponding to an open position. This embodiment can be made more cost effective, since fewer components are required, and also the weight of the indication device can be kept very low. By detecting the open position, it can be determined whether it is safe to touch the equipment, for instance for maintenance operations, and in many applications this information is sufficient to safely handle and operate the switching apparatus 100. Thus, this embodiment can be seen as a particularly simple and cost efficient version of the indication device, while still maintaining all the advantages of the main concept of the invention, namely the reliability and high speed of the indicator.

In this second embodiment, if a power source 8A of 10 V is used, as in the example given above, the measuring unit 8C would detect 0 V if the switching apparatus 100 is in the first, i.e. open, state and 10 V if it is not. In this embodiment, both a closed state and a malfunction would give the same value to the measuring unit 8C.

The circuit diagram for this second preferred embodiment differs from that shown in FIG. 4 in that the second switch 10B and the resistor R1 are eliminated, leaving only the resistor R2 and the first switch 10A, together with the input/output connections (via the insulated connector to point 8D and the connection through the support structure to point 8E, respectively) in the indication device 1.

Thanks to the invention according to any of the embodiments, the state of a fast closing switching apparatus can be detected in a safe way. By the interaction of the movable contact with the contact elements, the contact pins and the springs, the state of the switching apparatus can be detected in a simple and robust way which can stand the high switching velocities of the movable contact. Also, the presence of dirt or particles at the stationary contact 101 and the movable contact 102 of the switching apparatus 100 generally does not affect the operation of the indication device 1, and thanks to the use of a common electric potential such as ground or a local ground for the movable contact 102 and for the power source 8A, only one insulated connector is required from the indication device 1 to the detector arrangement 8, independent of the number of contact pins. Thereby, the space required at and around the switching apparatus 100 for the indication device 1 and the insulated connector is very low. Since the pressure inside a casing of the switching apparatus 100 can be very high, the use of only one insulated connector also lowers the risk of leakage from inside the casing.

It is to be noted that the indication device according to the invention can work with a variety of different switching apparatuses requiring only minor modifications. Thus, the invention is not to be seen as limited to the type of switching apparatus described herein. The invention can be used with switching apparatuses using low, intermediate and high voltage and is, as has been described in detail above, particularly beneficial where it is important for the switch to operate at high speed.

Figure 6:
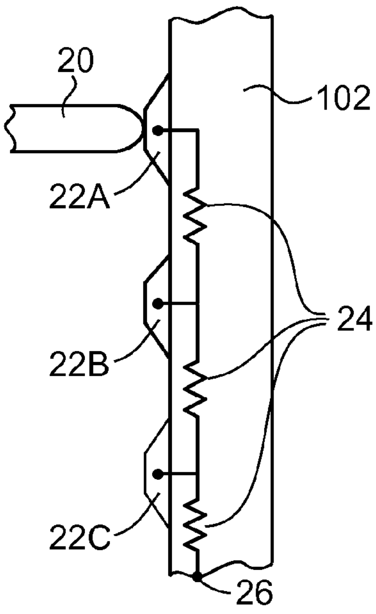
FIG. 6 shows another example of a device according to the invention.

FIG. 6 shows another example of an indicating device according to the invention including a contact pin 20 and a plurality of contact elements 22A-22C arranged to detect a plurality of states of the movable contact. In this example the movable contact 102 has been provided with three protruding contact elements 22 arranged electrically insulated from the movable contact and connected to earth via resistors 24. Alternatively, each contact element is individually connected to ground with a resistor of its own. The device may include several contact pins connected in parallel.

The invention can be varied in many ways within the scope of the appended claims. For instance, the preloading of the contact pins can be made using any type of spring element or other method of pushing them against the movable part, as will be readily understood by the person skilled in the art. Also, the detector arrangement and the position indicator can be an integrated unit located at the switching apparatus. If desired, the state of the switching apparatus can be determined by the indication device, as described above, but transferred by any suitable means to a remote control unit or device for analysis, such as a computer or the like. In an alternative embodiment, the same contact element on the movable contact can be used to form a switch with the first as well as the second contact pin. The device can easily be extended to detect additional positions by just adding more contact pins and connecting resistors to those pins. Thus, in other embodiments of the invention, it is possible to have three or more contact pins, and one or more corresponding contact parts to enable detection of more states/positions. As an alternative to the voltage meter, an ampere meter can be used for measuring the current in the circuit and to determine the state of the switching apparatus.

The invention claimed is:

1. A switching apparatus for closing an electric circuit of medium or high voltage level, the apparatus including a movable contact arranged linearly movable between a first and a second position, wherein the apparatus comprises a device for indicating the state of the switching apparatus, the device comprising:

at least one protruding contact element arranged on the movable contact;

a contact pin arranged at a distance from the movable contact, such that said contact element abuts the contact pin when the movable contact is in the first position and said contact element is at a distance from the contact pin when the movable contact is in the second position, whereby the contact element and the contact pin form an electrical switch; and a detector arrangement configured to detect when said electrical switch is closed and by that detect when the movable contact is in the first position, the detector arrangement comprises a power supply arranged to form a second electric circuit together with said electrical switch and a measuring unit arranged to measure the voltage or current in the second electric circuit, and the detector arrangement is configured to detect when the movable contact is in the first position based on the level of the measured voltage or current.

2. The switching apparatus according to claim 1, wherein the device comprises a first resistor arranged to form a closed electric circuit together with the electrical switch and the power supply.

3. The switching apparatus according to claim 2, wherein said first resistor is arranged in series with said first switch.

4. The switching apparatus according to claim 3, wherein the device comprises:

one or two protruding contact elements arranged on the movable contact; and a second contact pin arranged at a distance from the movable contact such that one of the one or two contact elements abuts the second contact pin when the movable contact is in the second position and said one of the one or two contact elements is at a distance from the second contact pin when the movable contact is in the first position, whereby said one of the contact elements and the second contact pin form a second electrical switch, and said detector arrangement is configured to detect when the second switch is closed and by that detect when the movable contact is in the second position.

5. The switching apparatus according to claim 3, wherein said detector arrangement is configured to detect when both the first mentioned switch and the second switch are opened at the same time, and by that detect when the movable contact is in a position between the first and the second position.

6. The switching apparatus according to claim 2, wherein the device comprises:

one or two protruding contact elements arranged on the movable contact; and a second contact pin arranged at a distance from the movable contact such that one of the one or two contact elements abuts the second contact pin when the movable contact is in the second position and said one of the one or two contact elements is at a distance from the second contact pin when the movable contact is in the first position, whereby said one of the contact elements and the second contact pin form a second electrical switch, and said detector arrangement is configured to detect when the second switch is closed and by that detect when the movable contact is in the second position.

7. The switching apparatus according to claim 2, wherein said detector arrangement is configured to detect when both the first mentioned switch and the second switch are opened at the same time, and by that detect when the movable contact is in a position between the first and the second position.

8. The switching apparatus according to claim 1, wherein the device comprises:

one or two protruding contact elements arranged on the movable contact; and a second contact pin arranged at a distance from the movable contact such that one of the one or two contact elements abuts the second contact pin when the movable contact is in the second position, wherein said one of the one or two contact elements is at a distance from the second contact pin when the movable contact is in the first position, whereby said one of the contact elements and the second contact pin form a second electrical switch, and said detector arrangement is configured to detect when the second switch is closed and by that detect when the movable contact is in the second position.

9. The switching apparatus according to claim 8, wherein the device comprises:

a first and a second protruding contact element arranged on the movable contact at a distance from each other, and said first mentioned contact pin is arranged such that the first contact element is in contact with the first contact pin when the movable contact is in the first position and the first contact element is at a distance from the first contact pin when the movable contact is in the second position, and said second contact pin is arranged such that the second contact element is in contact with said second contact pin when the movable contact is in the second position and said second contact element is at a distance from the second contact pin when the movable contact is in the first position.

10. The switching apparatus according to claim 9, wherein said second electrical switch is a part of said closed electric circuit.

11. The switching apparatus according to claim 8, wherein said second electrical switch is a part of said closed electric circuit.

12. The switching apparatus according to claim 11, wherein said detector arrangement is configured to detect whether the movable contact is in the first or second position based on the level of the measured voltage or current.

13. The switching apparatus according to claim 12, wherein said electric circuit comprises a second resistor arranged in series with the second switch.

14. The switching apparatus according to claim 12, wherein said second switch is arranged in parallel with said first mentioned switch and the power supply.

15. The switching apparatus according to claim 11, wherein said electric circuit comprises a second resistor arranged in series with the second switch.

16. The switching apparatus according to claim 15, wherein said second switch is arranged in parallel with said first mentioned switch and the power supply.

17. The switching apparatus according to claim 11, wherein said second switch is arranged in parallel with said first mentioned switch and the power supply.

18. The switching apparatus according to claim 1, wherein said detector arrangement is configured to detect when both the first mentioned switch and the second switch are opened at the same time, and by that detect when the movable contact is in a position between the first and the second position.

19. The switching apparatus according to claim 1, wherein said electric circuit is electrically connected to the movable contact via a support structure.

20. The switching apparatus according to claim 1, wherein the contact pin is spring loaded.

* * * * *